United States Patent
Chen et al.

(10) Patent No.: US 9,545,153 B2
(45) Date of Patent: Jan. 17, 2017

(54) SLIDE RAIL ASSEMBLY

(71) Applicants: KING SLIDE WORKS CO., LTD., Kaohsiung (TW); KING SLIDE TECHNOLOGY CO.,LTD., Kaohsiung (TW)

(72) Inventors: Ken-Ching Chen, Kaohsiung (TW); Shun-Ho Yang, Kaohsiung (TW); Chiang-Hsueh Fang, Kaohsiung (TW); Chun-Chiang Wang, Kaohsiung (TW)

(73) Assignees: KING SLIDE WORKS CO., LTD., Kaohsiung (TW); KING SLIDE TECHNOLOGY CO.,LTD., Kaohsiung (TW)

( * ) Notice: Subject to any disclaimer, the term of this patent is extended or adjusted under 35 U.S.C. 154(b) by 0 days.

(21) Appl. No.: 14/817,219

(22) Filed: Aug. 4, 2015

(65) Prior Publication Data
US 2016/0331136 A1 Nov. 17, 2016

(30) Foreign Application Priority Data
May 15, 2015 (TW) .............................. 104115695 A (51) Int. Cl.
*A47B 88/08* (2006.01)
*A47B 88/04* (2006.01)
*A47B 88/10* (2006.01)

(52) U.S. Cl.
CPC ............. *A47B 88/08* (2013.01); *A47B 88/044* (2013.01); *A47B 88/10* (2013.01)

(58) Field of Classification Search
CPC ........ A47B 88/08; A47B 88/10; A47B 88/044
USPC ....................................................... 248/298.1
See application file for complete search history.

(56) References Cited

U.S. PATENT DOCUMENTS

| | | | | |
|---|---|---|---|---|
| 6,230,903 | B1 * | 5/2001 | Abbott ................ | H05K 7/1421 211/190 |
| 6,557,960 | B2 * | 5/2003 | Shih .................... | H05K 7/1489 312/334.17 |
| 6,739,682 | B2 | 5/2004 | Shih | |
| 6,773,080 | B2 * | 8/2004 | Chen .................... | A47B 57/40 211/26 |
| 7,552,899 | B2 * | 6/2009 | Chen .................... | A47B 88/044 211/26 |
| 7,740,329 | B2 * | 6/2010 | Hsiung ................ | H05K 7/1489 312/223.1 |
| 8,028,965 | B2 | 10/2011 | Chen | |

(Continued)

FOREIGN PATENT DOCUMENTS

| | | | | |
|---|---|---|---|---|
| CA | 2431240 A1 * | 4/2003 | .......... | A47B 88/044 |
| CN | 101721057 A | 6/2010 | | |

(Continued)

*Primary Examiner* — Eret McNichols
(74) *Attorney, Agent, or Firm* — Winston Hsu; Scott Margo (57) ABSTRACT

A slide rail assembly includes a rail and a reinforcing member. The rail includes an upper wall, a lower wall and a longitudinal wall connected between the upper wall and the lower wall. The reinforcing member is attached to the rail and includes an upper wall, a lower wall and a middle wall connected between the upper wall and the lower wall of the reinforcing member. The upper wall and the lower wall of the reinforcing member correspond to the upper wall and the lower wall of the rail respectively. The middle wall of the reinforcing member corresponds to the longitudinal wall of the rail member.

12 Claims, 7 Drawing Sheets

(56) References Cited

U.S. PATENT DOCUMENTS

| | | | | |
|---|---|---|---|---|
| 8,371,454 | B2* | 2/2013 | Chen | A47B 88/044 211/26 |
| 9,144,173 | B2* | 9/2015 | Chen | E05D 15/08 |
| 2006/0152115 | A1* | 7/2006 | Dubon | A47B 88/044 312/334.8 |
| 2008/0036347 | A1* | 2/2008 | Liang | A47B 88/04 312/334.5 |
| 2008/0073469 | A1* | 3/2008 | Mushan | A47B 88/044 248/205.1 |
| 2008/0303390 | A1* | 12/2008 | Hsiung | H05K 7/1489 312/223.1 |
| 2014/0217049 | A1 | 8/2014 | Chen | |
| 2014/0265786 | A1 | 9/2014 | Chen | |
| 2014/0265788 | A1* | 9/2014 | Judge | H05K 7/1489 312/334.1 |

FOREIGN PATENT DOCUMENTS

| | | | | |
|---|---|---|---|---|
| EP | 2 438 835 | A1 | 4/2012 | |
| EP | EP 2896324 | A1 * | 7/2015 | ........... A47B 88/044 |
| TW | EP 2848158 | A1 * | 3/2015 | ........... A47B 88/044 |
| TW | EP 2893838 | A1 * | 7/2015 | ........... A47B 88/044 |

* cited by examiner

SLIDE RAIL ASSEMBLY

BACKGROUND OF THE INVENTION

1. Field of the Invention

The present invention relates to a slide rail assembly, and more particularly, to a slide rail assembly having a rail with a reinforcing structure.

2. Description of the Prior Art

U.S. Pat. No. 8,028,965 B2 discloses an adjustable bracket for a slide assembly. Wherein, the slide assembly (10) comprises an outer rail (12). The outer rail (12) is capable of mounting to a rack (90) through a connecting member (20) and a sliding member (50). The sliding member (50) is adjustably attached to a fixing base (30) of the slide assembly (10) for moving in a passage (38), and the sliding member (50) is capable of mounting to the rack (90) through a fixing member (70). The sliding member increases supporting strength for a sliding connection structure of the fixing base. On the other hand, the fixing member is capable of supporting the slide assembly for further enhancing supporting strength. The case is provided for reference.

SUMMARY OF THE INVENTION

The present invention relates to a slide rail assembly arranged having a rail with a reinforcing structure.

According to an embodiment of the present invention, a slide rail assembly comprises a first rail and a reinforcing member. The first rail comprises an upper wall, a lower wall, and a longitudinal wall connected between the upper wall and the lower wall. The reinforcing member is attached to the first rail. The reinforcing member comprises an upper wall, a lower wall, and a middle wall connected between the upper wall and the lower wall of the reinforcing member. The upper wall and the lower wall of the reinforcing member correspond to the upper wall and the lower wall of the first rail respectively. The middle wall of the reinforcing member corresponds to the longitudinal wall of the first rail.

According to another embodiment of the present invention, a slide rail assembly is configured to mount a carried object to a rack. The rack comprises a first post and a second post. The slide rail assembly comprises a first rail, a second rail, a third rail, a reinforcing member, a first bracket, and a second bracket. The first rail comprises an upper wall, a lower wall, and a longitudinal wall connected between the upper wall and the lower wall. The second rail is longitudinally movable relative to the first rail, and the carried object is configured to be mounted on the second rail. The third rail is movably connected between the first rail and the second rail. The reinforcing member is attached to a first portion of the first rail. The reinforcing member comprises an upper wall, a lower wall, and a middle wall connected between the upper wall and the lower wall of the reinforcing member. The middle wall of the reinforcing member corresponds to the longitudinal wall of the first rail, and the upper wall and the lower wall of the reinforcing member correspond to the upper wall and the lower wall of the first rail respectively. The first bracket is movably mounted to the reinforcing member and comprises an end wall mounted to the first post through at least one mounting member. The first bracket comprises an upper wall, a lower wall, and a middle wall connected between the upper wall and the lower wall of the first bracket. The middle wall of the first bracket corresponds to the middle wall of the reinforcing member, and the upper wall and the lower wall of the first bracket correspond to the upper wall and the lower wall of the reinforcing member respectively. The second bracket is attached to a second portion of the first rail and comprises an end wall mounted to the second post through at least one mounting member.

According to one of the above embodiments of the present invention, the slide rail assembly further comprises a bracket movably mounted to the reinforcing member. The bracket comprises an upper wall, a lower wall, and a middle wall connected between the upper wall and the lower wall of the bracket. An end wall is substantially connected to the middle wall of the bracket perpendicularly, and is connected to at least one mounting member capable of mounting to a post of a rack. The middle wall of the bracket corresponds to the middle wall of the reinforcing member. The upper wall and the lower wall of the bracket correspond to the upper wall and the lower wall of the reinforcing member respectively, and the upper wall and the lower wall of the bracket are extended with bending portions respectively facing side portions of the upper wall and the lower wall of the reinforcing member. The middle wall of the reinforcing member further comprises a blocking portion, when the bracket is moved relative to the reinforcing member to reach a position, an end portion of the middle wall of the bracket is blocked by the blocking portion of the reinforcing member.

According to one of the above embodiments of the present invention, a passage is defined by the upper wall, the lower wall, and the longitudinal wall of the first rail. The slide rail assembly further comprises a second rail and a third rail movably connected to each other. The third rail is movably connected to the first rail and is capable of moving relative to the first rail in the passage. Sliding aid members are arranged between the first rail, the second rail and the third rail.

According to one of the above embodiments of the present invention, the upper wall of the reinforcing member is arranged above the upper wall of the first rail. The lower wall of the reinforcing member is arranged below the lower wall of the first rail. The upper wall of the first bracket is arranged above the upper wall of the reinforcing member. The lower wall of the first bracket is arranged below the lower wall of the reinforcing member.

According to one of the above embodiments of the present invention, the upper wall and the lower wall of the first rail, the upper wall and the lower wall of the reinforcing member, and the upper wall and the lower wall of the bracket are bent toward a same direction relative to the longitudinal wall of the first rail.

One of the characteristics of the present invention is that a rail of the slide rail assembly is attached to a reinforcing member, and a bracket is movably mounted to the reinforcing member for moving relative to the reinforcing member.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
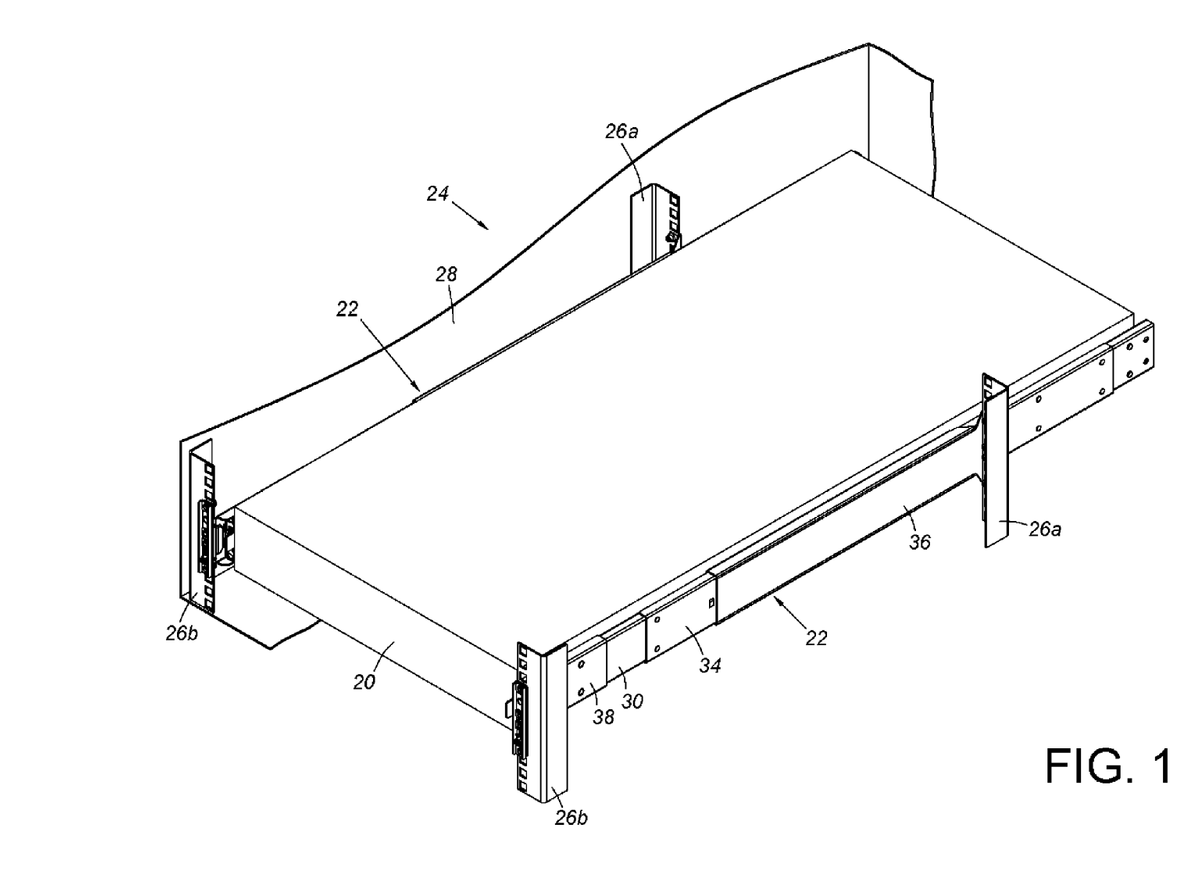
FIG. 1 is a diagram showing a slide rail assembly capable of mounting a carried object to a plurality of posts of a rack according to an embodiment of the present invention.

FIG. 1 shows a carried object 20 mounted to a rack 24 through a pair of slide rail assemblies 22 according to an embodiment of the present invention. Specifically, the rack 24 comprises two pairs of posts arranged at corresponding positions. Each pair of the posts, such as a first post 26a and a second post 26b can be arranged to be adjacent to a side board 28 of the rack 24 (FIG. 1 only illustrates one side of the rack 24).

Figure 2:
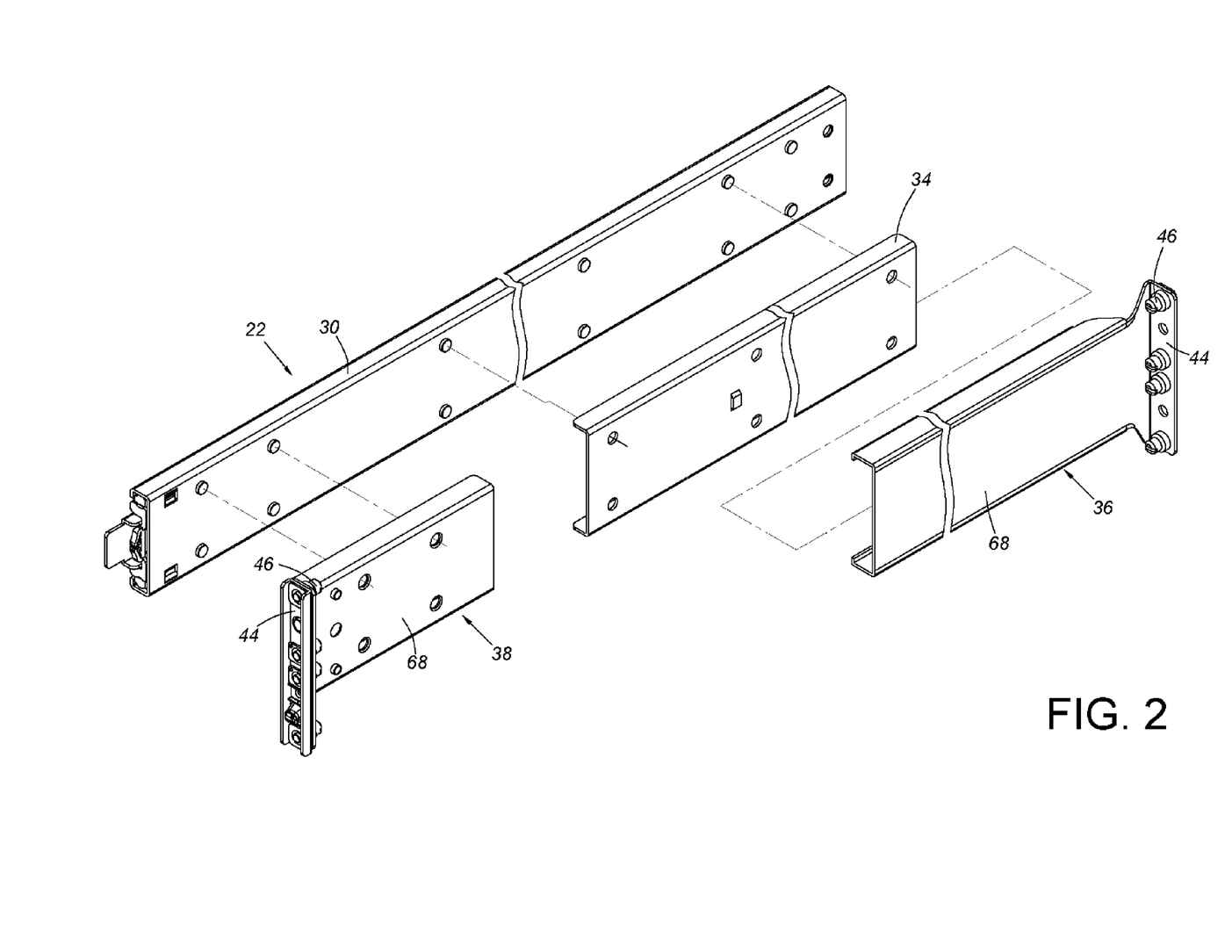
FIG. 2 is an exploded view of the slide rail assembly according to an embodiment of the present invention.
Figure 3:
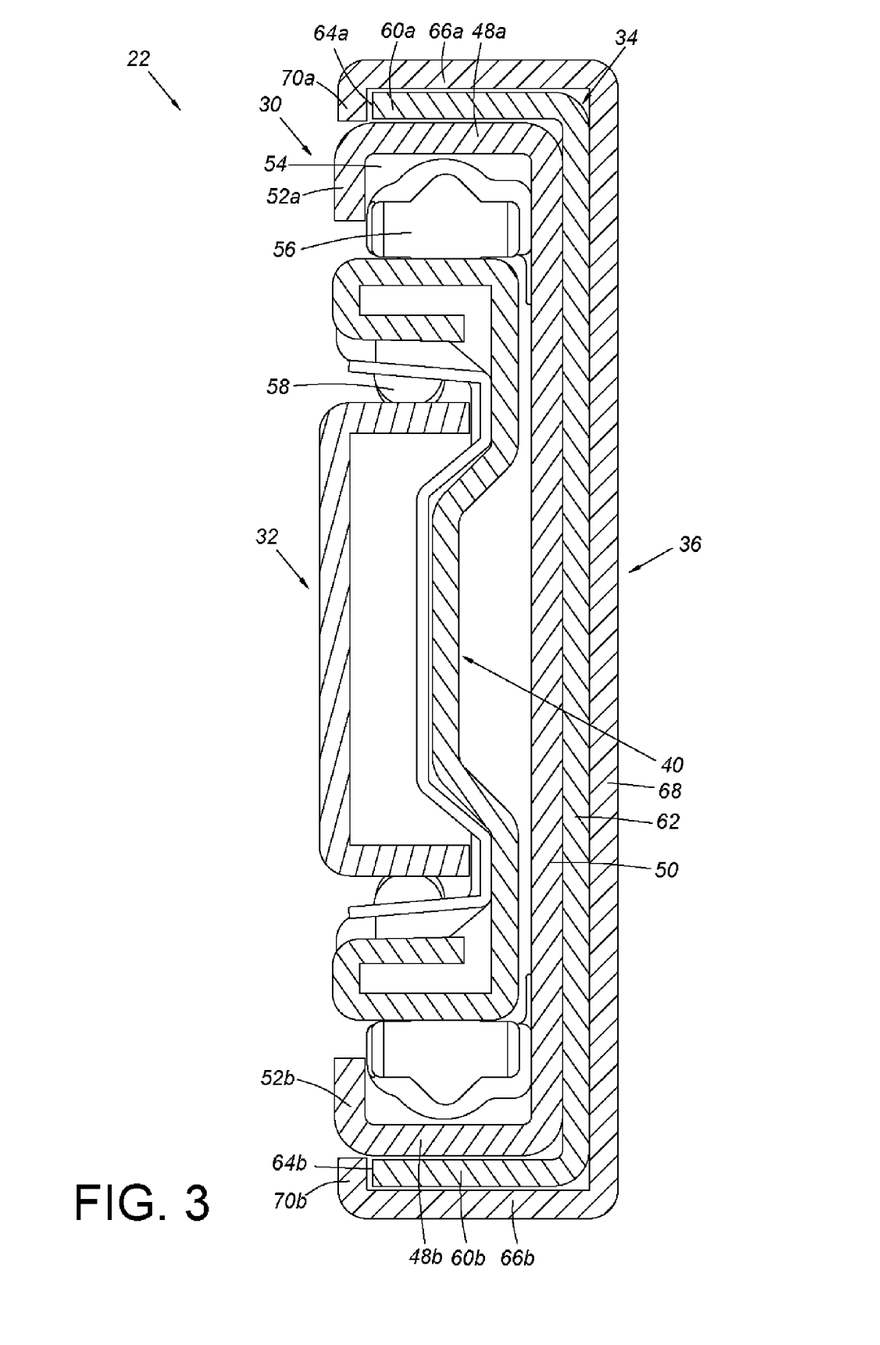
FIG. 3 is a cross-sectional view along line 3-3 in FIG. 4 showing corresponding structural relationship between each rail, reinforcing member, and bracket of the slide rail assembly.

Please refer to FIG. 2 and FIG. 3. Each slide rail assembly 22 comprises a first rail 30, a second rail 32, a reinforcing member 34, a first bracket 36, and a second bracket 38.

The second rail 32 is longitudinally movable relative to the first rail 30. The carried object 20 is configured to be mounted on the second rail 32, so that the carried object 20 can be pulled out from the rack 24 through displacement of the second rail 32 relative to the first rail 30. Preferably, the slide rail assembly 22 can further comprise a third rail 40 movably connected between the first rail 30 and the second rail 32 for elongating moving distance of the second rail 32 relative to the first rail 30.

The reinforcing member 34 is attached to a first portion of the first rail 30. For example, the reinforcing member 34 can be attached to the first rail 30 through riveting, screwing, latching, or soldering, but the present invention is not limited thereto. The first bracket 36 can be movably mounted to the reinforcing member 34, and is capable of moving to a position near a front portion of the first rail 30. On the other hand, the second bracket 38 is attached to a second portion of the first rail 30. For example, the second bracket 38 can be attached to a rear portion of the first rail 30 through riveting, screwing, latching, or soldering, but the present invention is not limited thereto.

As shown in FIG. 1, the first rail 30 is mounted to the first post 26a and the second post 26b through the two brackets 36 and 38. Moreover, as shown in FIG. 2, the two brackets 36 and 38 each comprises a middle wall 68 and an end wall 44 substantially connected to the middle wall 68 perpendicularly. Wherein, each of the end walls 44 of the first bracket 36 and the second bracket 38 is connected to at least one mounting member 46. The two brackets 36 and 38 are capable of being mounted to the first post 26a and the second post 26b through the mounting members 46 respectively.

As shown in FIG. 3, the first rail 30 comprises an upper wall 48a, a lower wall 48b, and a longitudinal wall 50 connected between the upper wall 48a and the lower wall 48b. The upper wall 48a and the lower wall 48b are bent toward a same direction relative to the longitudinal wall 50. Preferably, a first bending portion 52a and a second bending portion 52b are extended from the upper wall 48a and the lower wall 48b respectively. The first bending portion 52a is bent downward from the upper wall 48a, and the second bending portion 52b is bended upward from the lower wall 48b. A passage 54 is defined by the upper wall 48a, the lower wall 48b, the longitudinal wall 50, the first bending portion 52a, and the second bending portion 52b of the first rail 30. On the other hand, the second rail 32 and the third rail 40 are movably connected to each other. Wherein, the third rail 40 is movably connected to the first rail 30 and is capable of moving relative to the first rail 30 in the passage 54. Preferably, a first sliding aid member 56 is arranged between the first rail 30 and the third rail 40, and a second sliding aid member 58 is arranged between the third rail 40 and the second rail 32. The first sliding aid member 56 and the second sliding aid member 58 can comprise balls, rollers, or other similar objects to increase sliding smoothness between the first rail 30 and the third rail 40, and between the third rail 40 and the second rail 32.

The reinforcing member 34 is attached to the first rail 30 and comprises an upper wall 60a, a lower wall 60b, and a middle wall 62 connected between the upper wall 60a and the lower wall 60b of the reinforcing member 34. The middle wall 62 of the reinforcing member 34 corresponds to the longitudinal wall 50 of the first rail 30. The upper wall 60a and the lower wall 60b of the reinforcing member 34 are bent relative to the middle wall 62, and correspond to the upper wall 48a and the lower wall 48b of the first rail 30 respectively. Moreover, the upper wall 60a of the reinforcing member 34 is arranged above the upper wall 48a of the first rail 30, and the lower wall 60b of the reinforcing member 34 is arranged below the lower wall 48b of the first rail 30. According to the above arrangement, the reinforcing member 34 can be used to reinforce structural strength of each portion (such as the upper wall 48a, the lower wall 48b, and the longitudinal wall 50) of the first rail 30. In the present embodiment, the upper wall 60a and the lower wall 60b of the reinforcing member 34 comprise side portions 64a and 64b respectively.

The first bracket 36 is movably mounted to the reinforcing member 34. The first bracket 36 comprises an upper wall 66a, a lower wall 66b, and a middle wall 68 connected between the upper wall 66a and the lower wall 66b of the first bracket 36. The middle wall 68 of the first bracket 36 corresponds to the middle wall 62 of the reinforcing member 34. The upper wall 66a and the lower wall 66b of the first bracket 36 are bent relative to the middle wall 68, and correspond to the upper wall 60a and the lower wall 60b of the reinforcing member 34 respectively. Moreover, the upper wall 66a of the first bracket 36 is arranged above the upper wall 60a of the reinforcing member 34, and the lower wall 66b of the first bracket 36 is arranged below the lower wall 60b of the reinforcing member 34. Preferably, a first bending portion 70a and a second bending portion 70b are extended from the upper wall 66a and the lower wall 66b of the first bracket 36 respectively. The first bending portion 70a of the first bracket 36 is bent downward from the upper wall 66a, and the second bending portion 70b of the first bracket 36 is bent upward from the lower wall 66b. The first bending portion 70a of the upper wall 66a and the second bending portion 70b of the lower wall 66b of the first bracket 36 are configured to face the side portion 64a of the upper wall 60a and the side portion 64b of the lower wall 60b of the reinforcing member 34 and respectively.

Figure 4:
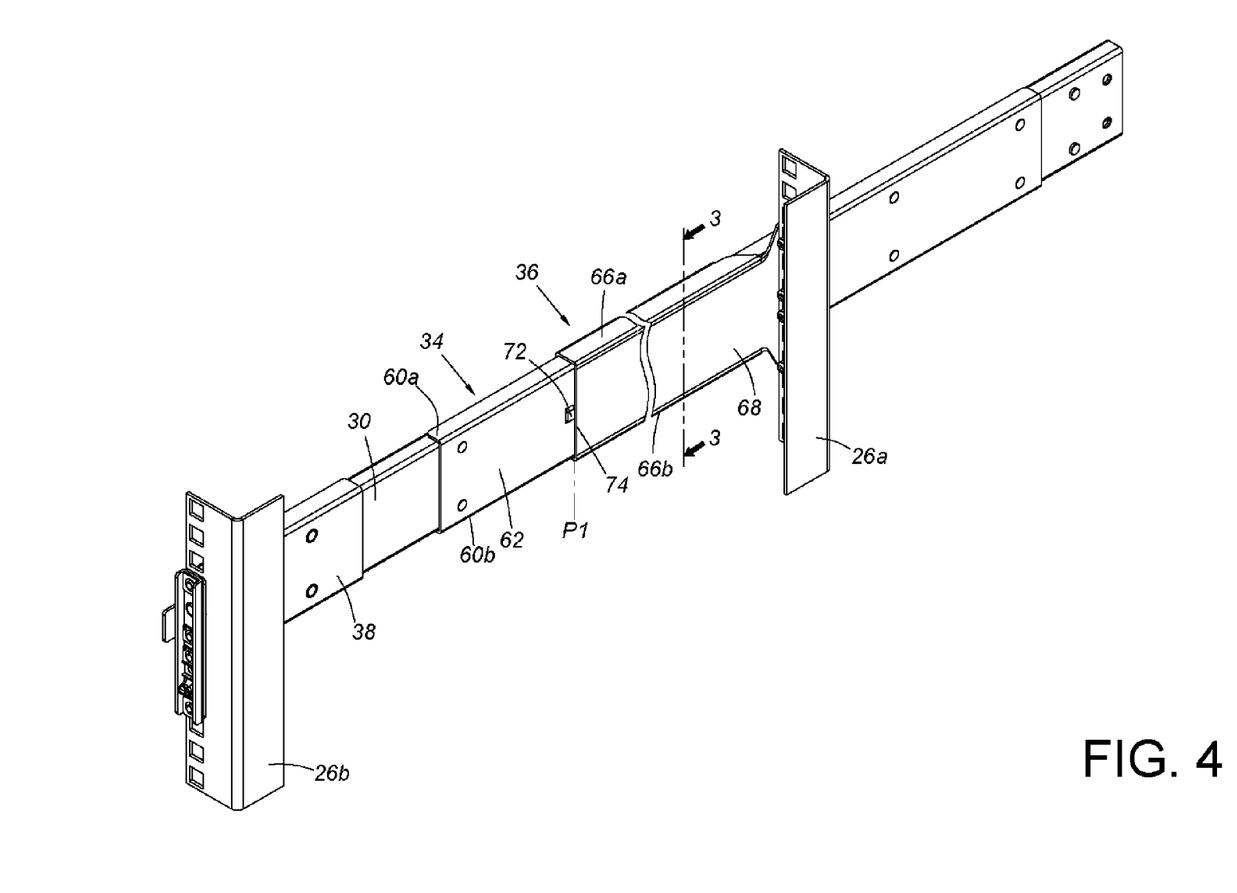
FIG. 4 is a diagram showing a bracket of the slide rail assembly being adjusted to a position for adapting the slide rail assembly to a distance between two posts according to an embodiment of the present invention.

Please refer to FIG. 3 and FIG. 4. Since the first bracket 36 is movably connected to the reinforcing member 34, the first bracket 36 can be adjusted and moved to a first position P1 relative to the reinforcing member 34 or the first rail 30. Specifically, through arranging the first bending portion 70a of the upper wall 66a and the second bending portion 70b of the lower wall 66b of the first bracket 36 to face the side portion 64a of the upper wall 60a and the side portion 64b of the lower wall 60b of the reinforcing member 34 respectively, the first bracket 36 can be ensured to move to the first position P1 along a longitudinal direction of the reinforcing member 34, and the first bracket 36 can be mounted to the first post 26a. On the other hand, the second bracket 38 can be mounted to the second post 26b. Preferably, the middle wall 62 of the reinforcing member 34 can further comprise a blocking portion 72. When the first bracket 36 is moved relative to the reinforcing member 34 to reach a position (such as the first position P1), an end portion 74 of the middle wall 68 of the first bracket 36 can be blocked by the blocking portion 72 of the reinforcing member 34.

Figure 5:
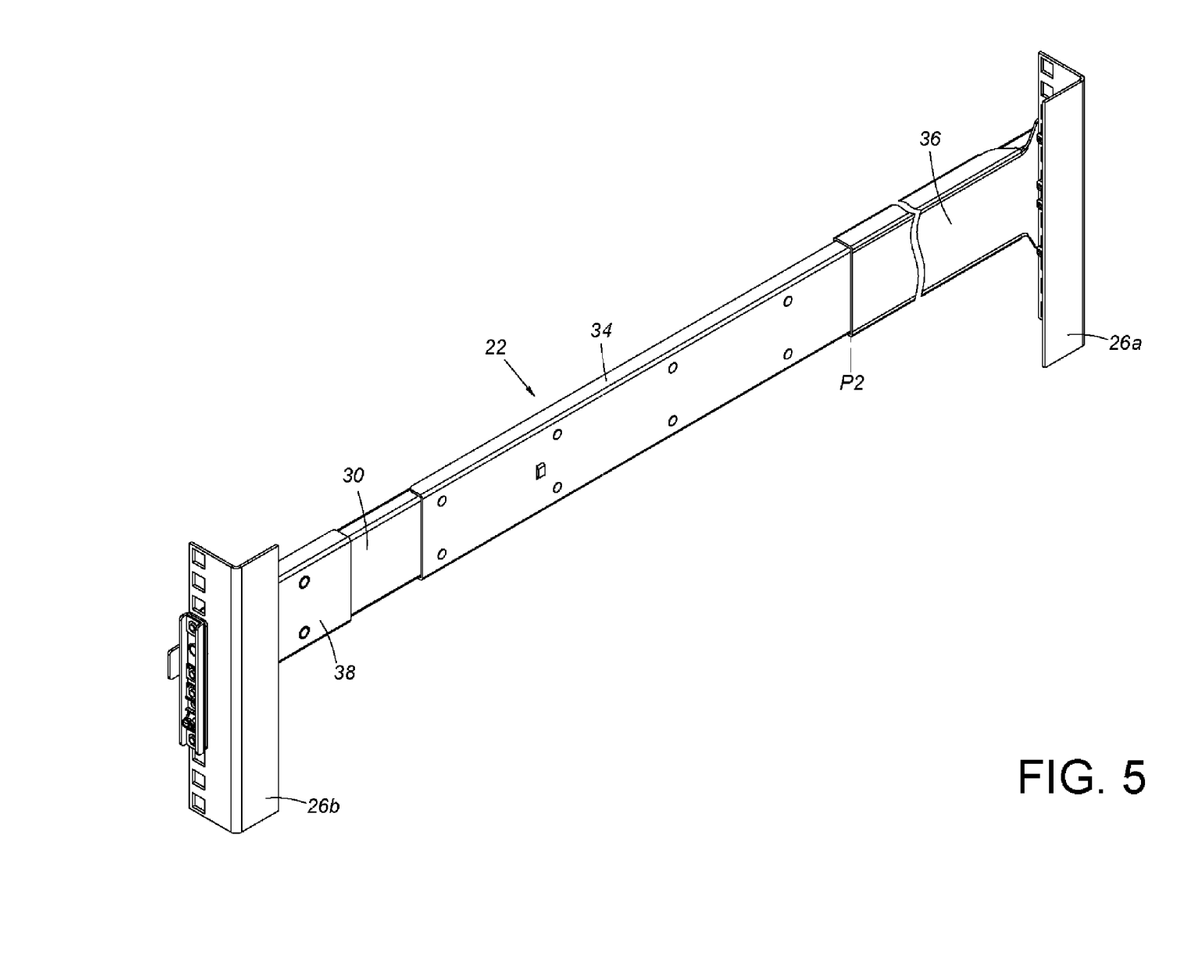
FIG. 5 is a diagram showing the bracket of the slide rail assembly being adjusted to another position for adapting the slide rail assembly to a distance between two posts according to an embodiment of the present invention.

As shown in FIG. 5, when a distance between the first post 26a and the second post 26b is different from the distance shown in FIG. 4, the first bracket 36 can be adjusted and moved to a second position P2 relative to the reinforcing member 34 or the first rail 30, for mounting the first bracket 36 to the first post 26a. On the other hand, the second bracket 38 can be mounted to the second post 26b.

As a result, the first bracket 36 of the slide rail assembly 22 can be adjusted and moved to different positions (such as the first position P1 or the second position P2) relative to the reinforcing member 34 or the first rail 30, so that the slide rail assembly 22 can be adapted to different distances between the first post 26a and the second post 26b.

Figure 6:
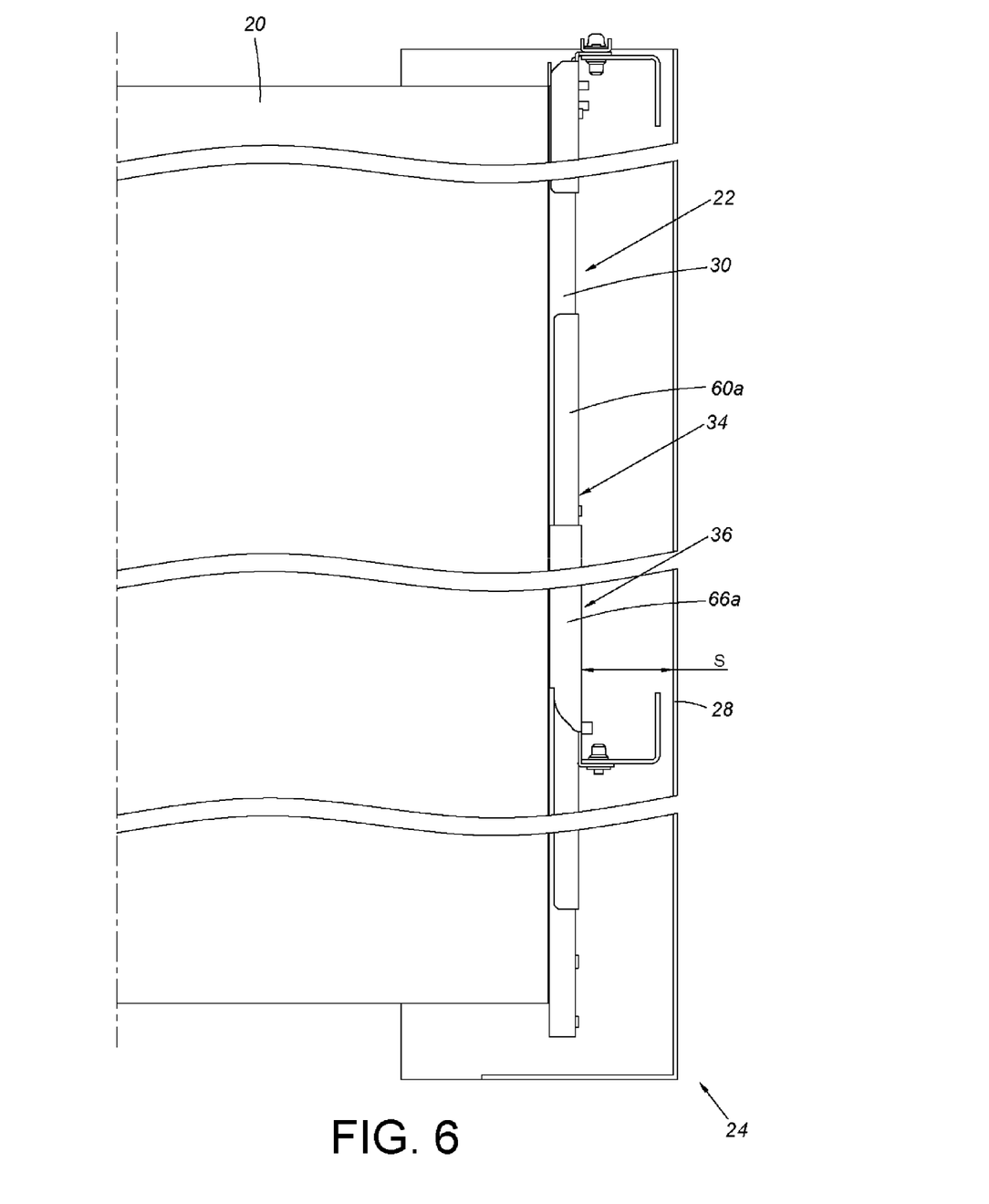
FIG. 6 is a diagram showing a carried object mounted to the posts within the rack through the slide rail assembly, wherein a space is provided between the slide rail assembly and a side board of the rack according to an embodiment of the present invention.

Please refer to FIG. 3 and FIG. 6. In the present embodiment, the upper wall 48a and the lower wall 48b of the first rail 30, the upper wall 60a and the lower wall 60b of the reinforcing member 34, and the upper wall 66a and the lower wall 66b of the first bracket 36 are arranged toward a same direction relative to the longitudinal wall 50 of the first rail 30, such as toward the carried object 20, which is opposite to a direction toward the side board 28 of the rack 24. Therefore, a space S between the side board 28 of the rack 24 and the slide rail assembly 22 can be utilized for additionally accommodating other parts or objects, in order to satisfy requirements of placing certain related parts or objects in the space S.

Figure 7:
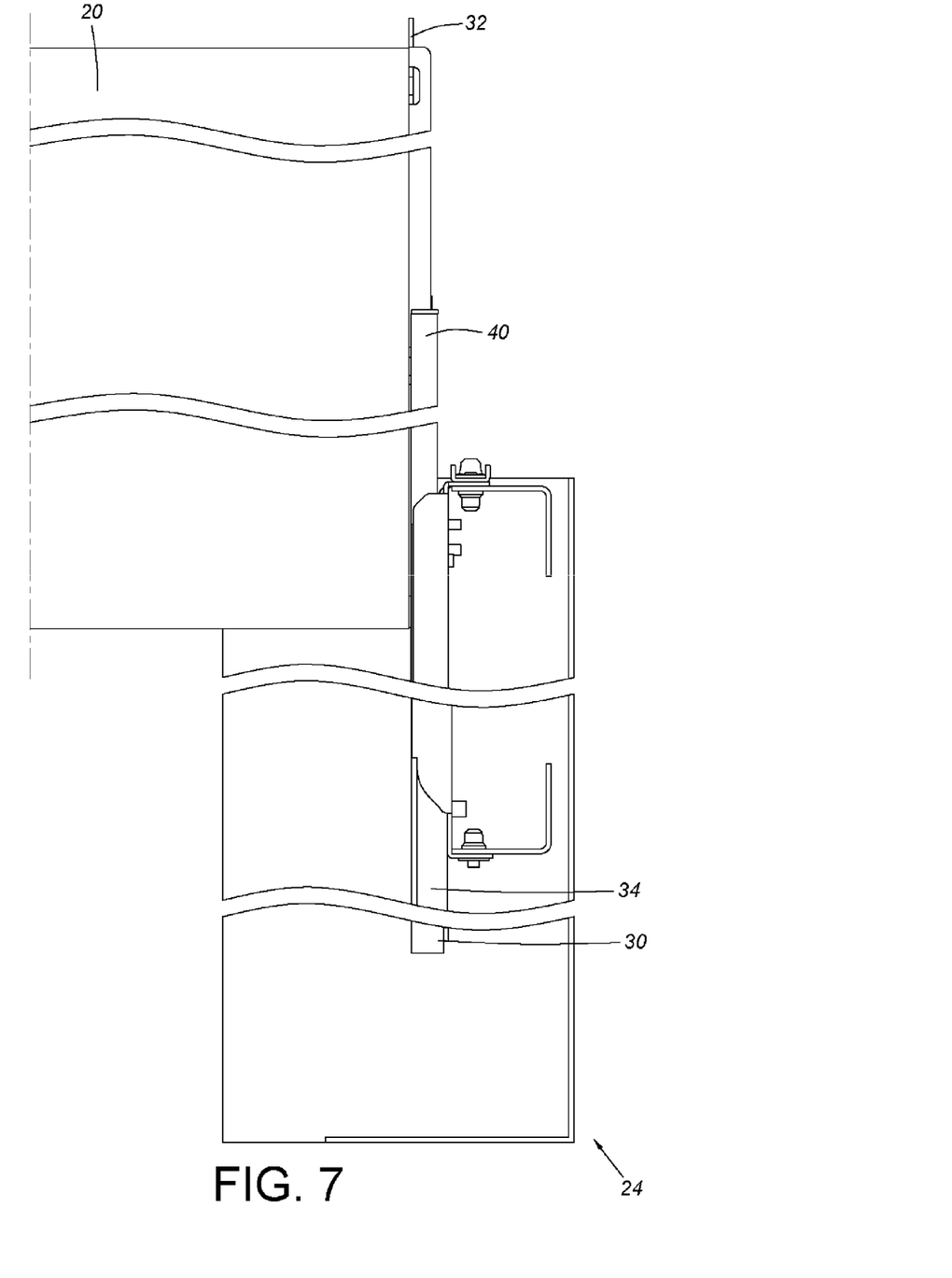
FIG. 7 is a diagram showing the carried object pulled outside the rack through slide rails of the slide rail assembly according to an embodiment of the present invention.

As shown in FIG. 7, since the reinforcing member 34 increases structural strength of the first rail 30, when the carried object 20 is pulled outside the rack 24 through longitudinal displacement of the second rail 32 and the third rail 40 relative to the first rail 30, the first rail 30 can support the third rail 40, the second rail 32, and the carried object 20 more effectively.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:
1. A slide rail assembly, comprising:
   a first rail comprising an upper wall, a lower wall, and a longitudinal wall connected between the upper wall and the lower wall;
   a reinforcing member attached to the first rail, the reinforcing member comprising an upper wall, a lower wall, and a middle wall connected between the upper wall and the lower wall of the reinforcing member, the upper wall and the lower wall of the reinforcing member corresponding to the upper wall and the lower wall of the first rail respectively, the middle wall of the reinforcing member corresponding to the longitudinal wall of the first rail; and
   a bracket movably mounted to the reinforcing member, the bracket comprising an upper wall, a lower wall, and a middle wall connected between the upper wall and the lower wall of the bracket, the middle wall of the bracket corresponding to the middle wall of the reinforcing member, the upper wall and the lower wall of the bracket corresponding to the upper wall and the lower wall of the reinforcing member respectively, and the upper wall and the lower wall of the bracket being extended with bending portions respectively facing side portions of the upper wall and the lower wall of the reinforcing member;
   wherein the upper wall and the lower wall of the first rail, the upper wall and the lower wall of the reinforcing member, and the upper wall and the lower wall of the bracket are arranged toward a same direction relative to the longitudinal wall of the first rail.

2. The slide rail assembly of claim 1, wherein the bracket further comprises an end wall substantially connected to the middle wall of the bracket perpendicularly, and the end wall is connected to at least one mounting member capable of mounting to a post of a rack.

3. The slide rail assembly of claim 1, wherein the middle wall of the reinforcing member further comprises a blocking portion, when the bracket is moved relative to the reinforcing member to reach a position, an end portion of the middle wall of the bracket is blocked by the blocking portion of the reinforcing member.

4. The slide rail assembly of claim 1, wherein a passage is defined by the upper wall, the lower wall, and the longitudinal wall of the first rail, the slide rail assembly further comprises a second rail and a third rail movably connected to each other, the third rail is movably connected to the first rail and capable of moving relative to the first rail in the passage.

5. The slide rail assembly of claim 4, wherein sliding aid members are arranged between the first rail, the second rail, and the third rail.

6. The slide rail assembly of claim 1, wherein a carried object is configured to be mounted on the slide rail assembly, and wherein the upper wall and the lower wall of the first rail, the upper wall and the lower wall of the reinforcing member, and the upper wall and the lower wall of the bracket are arranged toward the carried object.

7. A slide rail assembly, configured to mount a carried object to a rack, the rack comprising a first post and a second post, the slide rail assembly comprising:
   a first rail comprising an upper wall, a lower wall, and a longitudinal wall connected between the upper wall and the lower wall;
   a second rail longitudinally movable relative to the first rail, the carried object being configured to be mounted on the second rail;
   a third rail movably connected between the first rail and the second rail;
   a reinforcing member attached to a first portion of the first rail, the reinforcing member comprising an upper wall, a lower wall, and a middle wall connected between the upper wall and the lower wall of the reinforcing member, the middle wall of the reinforcing member corresponding to the longitudinal wall of the first rail, and the upper wall and the lower wall of the reinforcing member corresponding to the upper wall and the lower wall of the first rail respectively;

a first bracket movably mounting to the reinforcing member and configured to be mounted to the first post, the first bracket comprising an upper wall, a lower wall, and a middle wall connected between the upper wall and the lower wall of the first bracket, the middle wall of the first bracket corresponding to the middle wall of the reinforcing member, and the upper wall and the lower wall of the first bracket corresponding to the upper wall and the lower wall of the reinforcing member respectively; and a second bracket attached to a second portion of the first rail and configured to be mounted to the second post;

wherein the upper wall and the lower wall of the first rail, the upper wall and the lower wall of the reinforcing member, and the upper wall and the lower wall of the first bracket are arranged toward a same direction relative to the longitudinal wall of the first rail;

wherein the upper wall of the reinforcing member is arranged above the upper wall of the first rail, the lower wall of the reinforcing member is arranged below the lower wall of the first rail, the upper wall of the first bracket is arranged above the upper wall of the reinforcing member, the lower wall of the first bracket is arranged below the lower wall of the reinforcing member.

8. The slide rail assembly of claim 7, wherein the first bracket and the second bracket each comprises an end wall, the end wall of the first bracket and the end wall of the second bracket are mounted to the first post and the second post through mounting members respectively.

9. The slide rail assembly of claim 7, wherein the middle wall of the reinforcing member further comprises a blocking portion, when the first bracket is moved relative to the reinforcing member to reach a position, an end portion of the middle wall of the first bracket is blocked by the blocking portion of the reinforcing member.

10. The slide rail assembly of claim 7, wherein a passage is defined by the upper wall, the lower wall, and the longitudinal wall of the first rail, the third rail is movably connected to the first rail and capable of moving relative to the first rail in the passage.

11. The slide rail assembly of claim 7, wherein sliding aid members are arranged between the first rail, the second rail, and the third rail.

12. The slide rail assembly of claim 7, wherein the upper wall and the lower wall of the first rail, the upper wall and the lower wall of the reinforcing member, and the upper wall and the lower wall of the first bracket are arranged toward the carried object.

* * * * *